United States Patent [19]

Moll

[11] Patent Number: 4,811,482
[45] Date of Patent: Mar. 14, 1989

[54] METHOD FOR PRODUCING MOLDED CIRCUIT BOARDS

[76] Inventor: Kenneth W. Moll, 5 Carrol St., East Northport, N.Y. 11731

[21] Appl. No.: 81,837

[22] Filed: Aug. 5, 1987

[51] Int. Cl.⁴ .............................................. H01K 3/22
[52] U.S. Cl. ...................................... 29/848; 174/68.5
[58] Field of Search ................. 174/68.5; 29/832, 848, 29/849, 846, 825

[56] References Cited

U.S. PATENT DOCUMENTS

| | | | |
|---|---|---|---|
| 3,077,658 | 2/1963 | Wharton | 29/825 |
| 3,430,338 | 3/1969 | Fhaherty | 174/68.5 X |
| 3,889,363 | 6/1975 | Davis | 174/68.5 X |
| 4,710,419 | 12/1987 | Gregory | 174/68.5 X |

OTHER PUBLICATIONS

IBM Tech. Discl. Bull., vol. 2, No. 1, Jun. 1959, p. 9, by Haddad et al.
IBM Tech. Discl. Bull., vol. 9, No. 11, p. 1520, Apr. 1967, by Kollmeier et al.

Primary Examiner—Carl J. Arbes
Attorney, Agent, or Firm—Hoffmann & Baron

[57] ABSTRACT

A method for producing circuit boards having embedded three-dimensional wiring patterns and exposed mounting pads for receiving surface mounted components and terminals in which the exposed mounting pads are formed by forming junctions between the conductors and a substrate which is in turn used as at least a portion of mold for receiving hardenable material for encapsulating the conductors and forming the circuit board and in which the junctions become exposed to define mounting pads when the substrate is removed.

7 Claims, 3 Drawing Sheets

METHOD FOR PRODUCING MOLDED CIRCUIT BOARDS

BACKGROUND OF THE INVENTION

The present invention relates to methods for producing 3-dimensional wiring in encapsulated circuit boards for receiving surface mountable components and devices.

Initially circuit boards were designed to receive components such as semiconductors, resistors and capacitors by means of the conductor leads on the component which typically entered holes in the circuit board for soldering to terminals on the reverse side. More recently surface mountable components have been developed in which the mounting is effected by soldering terminal feet on the component to surface pads or lands on the surface of the board. The surface pads while representing a substantial improvement in circuit board technology are themselves difficult to fabricate. One method of forming such pads is disclosed in U.S. Pat. No. 3,688,396 in which a conductive metal layer of weldable material is etched to form a pattern of conductive lands or pads. In the process of fabrication, electrical conductors usually in the form of wires are joined to the inner or normally non-exposed surface of the pads. When the conductors are subsequently encapsulated in a molding material such as plastic there remain the exposed surfaces of the pads flush with the hardened encapsulating material to which surface-mountable components can be subsequently attached.

The object of the present invention is to provide a less complex and less expensive method of producing terminal pads on flat, single-sided, two-sided, or 3-dimensional circuit boards which will accommodate surface mount components and devices.

SUMMARY OF THE INVENTION

One preferred method for producing a 3-dimensional circuit board consists of temporarily joining, an array of conductor leads to a temporary base or substrate, with the lead ends of the conductors themselves forming pads or lands at the temporary joint interface for receiving subsequently mounted surface-mountable components. The temporary junctions between the base and the conductors can be secured by solder, a conductive adhesive, metallurgical or ultrasonic bonding, or any other suitable bonding material. The electrical conductors are encapsulated in a suitable molding material such as plastic using the temporary base substrate as part of the confining mold, after which the temporary base is removed by separating the temporary bonds between the conductors and the substrate as the substrate is separated from the finished board. There will remain in the surface of the molded circuit board flat lands or pads representing the exposed surfaces of the electrical conductors themselves which will be mirror images of the proximate surface of the temporary base or substrate.

In one preferred embodiment of the invention the temporary bonds between the temporary base and the conductor ends can be parted by heating to release the solder coupling, in which case the temporary base can be reused. Alternatively, the base can be dissolved by chemical etching.

DESCRIPTION OF THE PREFERRED EMBODIMENTS OF THE INVENTION

Figure 1:
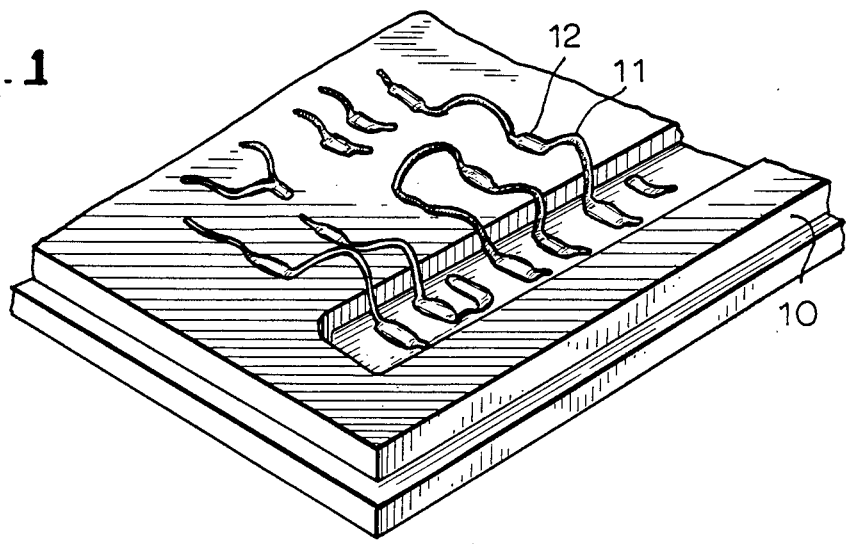
FIG. 1 is an isometric view of the working surface of a temporary base or substrate to which electrical conductors have been temporarily attached.

There is shown in FIG. 1 a portion of a temporary substrate or base 10 which can be formed of a solderable material such as brass or copper. If desired, the surface of the substrate can be coated with a thin layer of tin or solder, or any other media applicable to the end result. The surface of the substrate constitutes the mirror image of the surface of the final circuit board configuration and forms part of a mold for the encapsulating material, all as described below.

Figure 1A:
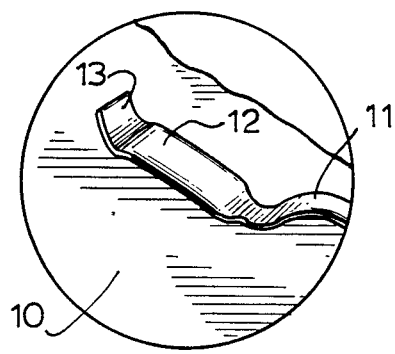
FIG. 1A is an enlarged view showing a single electrical conductor end joined to the surface of the temporary substrate.

Electrical conductors 11, in this case ribbon wire conductors are temporarily joined as by soldering, to the substrate at predetermined points to form the eventual surface mount-pads and to define the desired 3-dimensional electrical circuit. It will be observed that between pads 12 the conductors are disposed out of the plane of the substrate surface in the 3-dimensional configuration. As such, and with the ability to cross over each other, very complex circuits can be fabricated. Referring to FIG. 1A, the area of the juncture between the conductor 11 to the substrate 10 will constitute the area of the finished pad or land. The free end of the electrical conductor is bent upwardly in a tail 13 which contributes to the mechanical bond which will occur when the conductor is encapsulated. The electrical conductors can be formed of any suitable material such as copper, silver, gold or other conductive media and can if desired be coated with a thin solderable coating such as tin, solder or silver. Wire shape and size is selected according to the pad size required.

While ribbon wire is shown, square or round wire can be used although in the latter case pressure should be applied to deform the wire to establish an enlarged pad area. The wire can, if desired be insulated with coatings such as solderable class polyurethane or polyester which are displaced or dissolved at the solder joint interface to permit suitable joint adhesion with the substrate. The temporary solder joints can be produced with reflow soldering equipment utilizing resistance, ultrasonic, thermocompression or other suitable system and conventional wire dereeling and cutoff apparatus may be used for applying the conductors to the substrate and defining the 3-dimensional circuitry.

Automatic soldering equipment using relatively movable soldering heads and platens is well known in the art and need not be specifically disclosed herein. Using such equipment to carry out the present invention the platen (not shown) can be heated to preheat the substrate which it carries to a temperature slightly below the melting point of the solder or bonding media to speed up the process. For example, the substrate should be heated to a temperature of approximately 300 to 325 degrees if a solder having a melting point of 360–380 degrees F. were used.

In order to produce a complete circuit, the platen may be made to move in a preprogrammed manner for each required position. The wire is dereeled and cut off where necessary to produce low self-supporting wire loops between joints. Where dense circuitry might result in unwanted wire contact, insulation such as solderable polyurethane or solderable polyester can be used on the wire.

The bond to the substrate defines the shape of the pad 12 which is in turn determined by the size of the wire and the tip of the soldering head which engages it. For example, a 0.020 inch wide ribbon wire applied by a tip having a length of 0.060 inches will produce a pad size of approximately 0.020 by 0.060 inches. Round annealed copper wire of 0.015–0.018 inches in diameter can be flattened under sufficient pressure and heat to produce a pad 0.020 inches in width.

Figure 2:
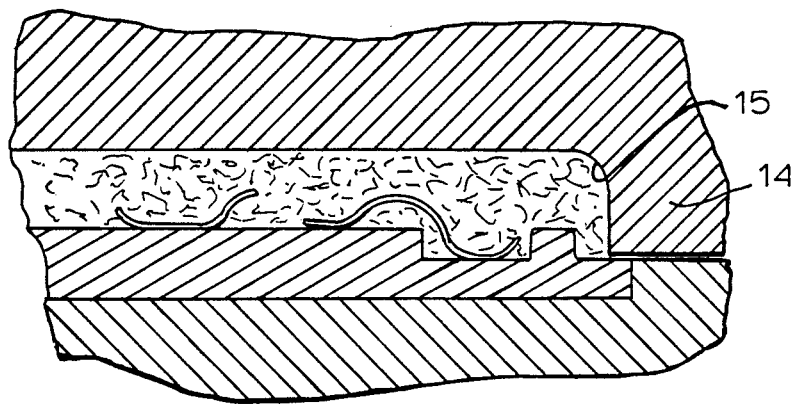
FIG. 2 is a fragmentary view in enlarged scale and in cross-section showing the 3-dimensional electrical conductor array embedded in an encapsulating material.

Referring to FIG. 2, the conductors and substrate are shown incorporated in a mold 14 the cavity 15 of which is filled with encapsulating material such as plastic to embed and constrain the electrical conductors. Various encapsulating processes can be used such as casting, injection or transfer molding. Selection of the encapsulating material is dependent upon structural environmental and electrical requirements. Thermoset plastics such as epoxy, phenolics, polyesters and diallylphthalate, with or without reinforcing fillers can be used as can castable ceramics or elastomers. It is essential that the casting or mold-cure temperature be below the melting point of the solder or bonding media to preserve the pad joints during the molding process. The following are examples of compatible material selections for this purpose:

1. Solder - 60 Sn/40 Pb
   Melting temperature 361–379 degrees F.
   Encapsulating material - U.S. Prolam E-7074
   High temperature fiberglass filled epoxy
   Molding temperature 270–340 degrees F.
   Heat deflection temperature 500 degrees F.
2. Solder - 95 Sn/5Sb
   Melting temperature 450–464 degrees F.
   Encapsulating material - Fiberite FM-16771
   Fiberglass filed phenolic
   Molding temperature 330–390 degrees F.
   Heat deflection temperature 600 degrees .F
3. Solder - 63 Sn/37 Pb
   Melting temperature 361° F.
   Encapsulating Material - Aremco, Ceramacast #510
   Castable ceramic
   Mold at room temp. and cure at 200° F.
   Max. operating temp. 3200° F.

Figure 3:
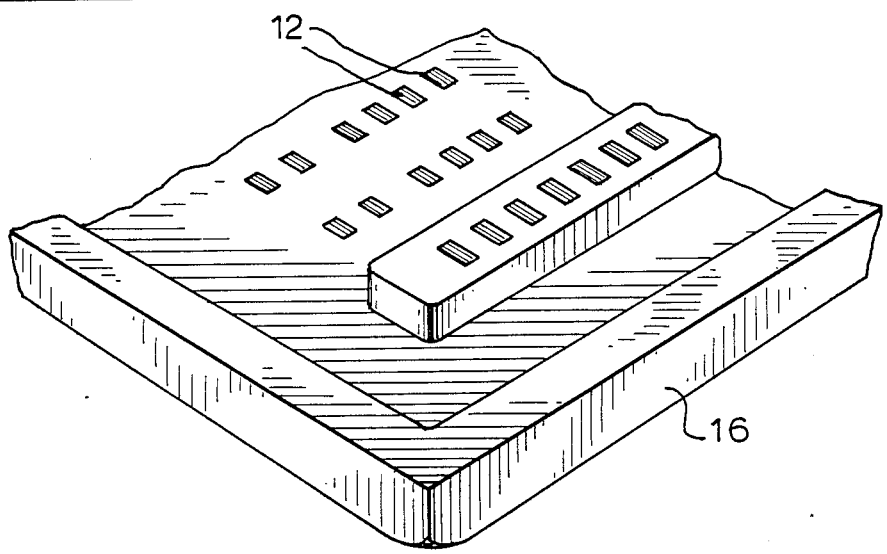
FIG. 3 shows a portion of the encapsulating material of FIG. 2 removed from the mold and the substrate to expose the originally temporarily bonded surfaces of the conductors which now constitute mounting pads or lands.

In FIG. 3 there is shown the molded circuit assembly 16 removed from the mold and detached from the substrate. To effect the separation it may be necessary to heat the mold assembly and substrate using an oven to the reflow melt temperature of the solder or bonding media, causing the temporary substrate to separate from the circuit assembly to expose the mounting pads 12. In the molded circuit configuration of FIGS. 1–4, a surface interconnect boss 17 having its own array of electrical contact pads 18 was formed as part of the molding process thus obviating the need for installing a separate connector.

Figure 4:
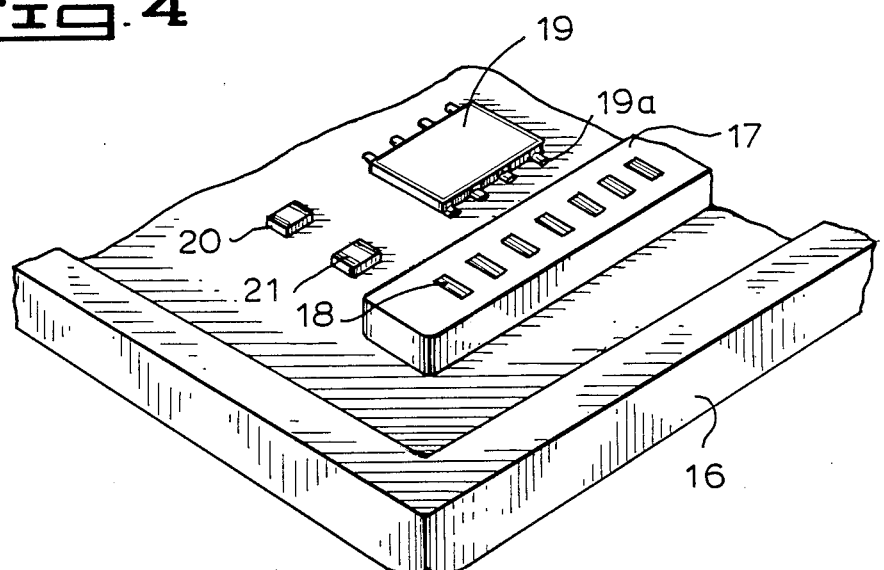
FIG. 4 shows the molded assembly of FIG. 3 with surface mountable components joined to the pads by means of their terminal feet.

As best seen in FIG. 4, circuit components 19, 20 and 21 have been mounted on the pads 12 the location of which, was as described above, prearranged to precisely match the electrical connector feet 19a on the surface-mountable components. The union between the connectors 19A and the pad 12 can be effected for example by soldering.

Figure 5:
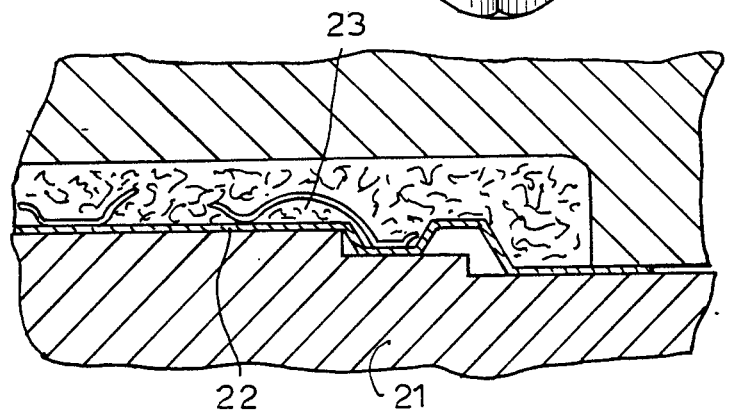
FIG. 5 is a fragmentary view in cross-section corresponding to FIG. 2 illustrating another embodiment of the invention.

Referring to FIG. 5, another method of producing the circuit and surface pads is illustrated. In this embodiment the temporary substrate 21 carries a thin sheetmetal or other suitable layer 22 which must be weldable or bondable but dissimilar from the material of which the electrical conductors 23 are formed to allow the thin substrate portion to be chemically dissolved without etching the wire. An example of materials which can be used for the thin sheetmetal and for the conductors are aluminum for the sheetmetal and copper for the conductors. Once the substrate has been removed, the exposed pad surfaces are cleaned and coated with solder or other media to be placed in condition for receiving the surface-mountable components.

Figure 6:
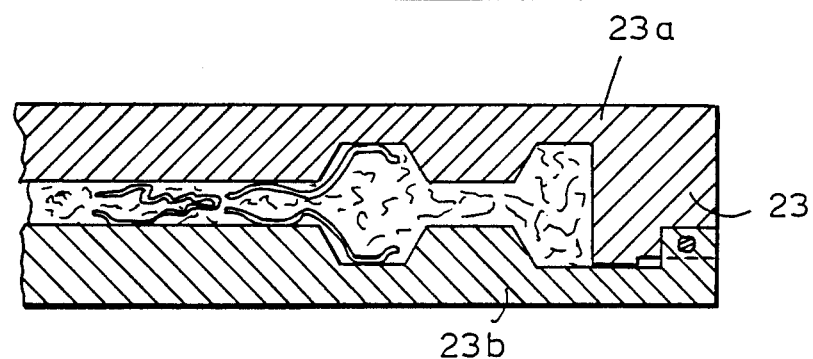
FIG. 6 is a view in cross-section illustrating still another embodiment of the invention in which exposed mounting pads are disposed on both sides of the encapsulated board.

Referring to FIG. 6, there is shown a double-sided, flat molded circuit board incorporating two sets of 3-dimensional circuits. The board is formed by using a hinged mold 23 having upper and lower parts 23a and 23b respectively. The mold cavities form the substrate and the electrical conductors are joined thereto in the manner described above with the mold open, thus enabling a double-sided circuit to be formed. When the assembly is closed as shown in FIG. 6, the two halves define the mold as well as two substrates. The encapsulating material is introduced into the mold and hardened after which the mold is heated or cooled to separate the pad joints therewith and, when the mold is removed, to expose the pad surfaces.

Figure 7:
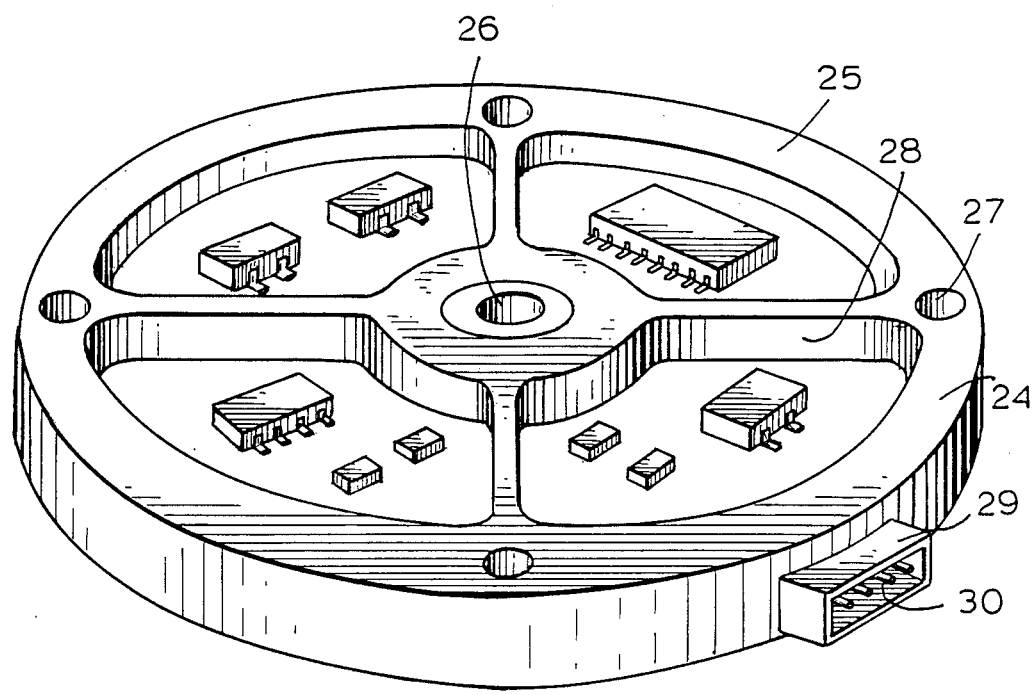
FIG. 7 is a view in perspective showing an embodiment of the invention in which the material encapsulating the conductors and on which the surface mountable components are disposed is itself a frame component of another product, in this case the end-piece of the housing of an electric motor.

In accordance with the invention, the molded circuit board carrying the surface mounted components can itself be formed to be the part of another assembly. Referring to FIG. 7, the molded circuit board 24 has been cast to form an endpiece for the housing for an electric motor, the surface mounted components 25 thereon comprising the motor controlling circuit. The molded part 24 includes a molded-in shaft bearing 26, bolt apertures 27 and suitable rigidizing ribs 28. Also illustrated in FIG. 7 is a molded-in integral connector 29, the connector terminal pins 30 of which are attached by soldering or bonding to electrical connectors within the molded plastic. If heat-sensitive components are to be used they can in accordance with the invention be cast into a ceramic encapsulated assembly in which the finished encapsulated ceramic circuit then protects the molded-in components from adverse heat yet allows other external surface mount components to be used.

It will be understood also that interconnection between circuits, similar to mother-daughter board assemblies can be incorporated into 3-dimensional bosses with surface pads such as that identified by the numeral 17 in FIG. 4 in which the boss can permit proper keying or location for the mated parts. It will be understood that the mated assemblies (not shown) can then be soldered or joined together by heating the solder or other media to the reflow temperature with the pads in engagement with each other. To prevent unsoldering of prior soldered components, lower melting point solder should be used on the interconnect pads.

It will be understood that the invention can take other forms and arrangements and that it should not, therefore, be regarded as limited except as defined in the following claims.

I claim:

1. In a method for fabricating circuitry for electronic components in which the circuitry has three-dimensionally disposed electrical conductors and an array of flat terminal pads on an exposed surface connected to the conductors, the steps of forming temporary, bonded junctions between electrical conductors in the circuitry and a temporary substrate at predetermined terminal sites in which the area of each junction constitutes the area of an eventual terminal pad and with the conductors passing out of the plane of the substrate between junctions establishing a mold within which to encapsulate the electrical conductors, at least a portion of the surface of the substrate comprising at least a portion of the interior of the mold, injecting hardenable molding material into the mold to encapsulate the conductors and to surround the backs and sides of each of the terminal pads and separating the mold from the hardened molding material including separating the temporarily bonded junctions between the substrate and the electrical conductors to expose the terminal pads.

2. The method of claim 1 including the steps of joining the electrical conductors to the substrate by means of bonding functions selected from among soldering, resistance heating, ultrasonics, welding and thermocompression.

3. The method of claim 1 including the step of forming an electrical connector part concomitantly with the encapsulation of the circuitry by providing a mold for the connector part in the encapsulating mold.

4. The method of claim 1 including the step of forming a dissolvable substrate layer on a supporting surface prior to forming the temporary junctions thereon with the electrical conductors and dissolving the layer to expose the terminal pads.

5. The method of claim 1 including the step of forming the encapsulating mold as a mold defining a castable part for an electrical device.

6. The method of claim 1 in which the electrical conductors are pressure deformed on the temporary substrate to enlarge the area of the junctions.

7. The method as set forth in claim 1 wherein the step of forming each junction on the substrate further includes dereeling conductor wire from a common source and applying pressure on the wire to deform the wire to form the terminal pad.

* * * * *